United States Patent [19]

Kawasumi et al.

[11] 4,231,848

[45] Nov. 4, 1980

[54] METHOD FOR MAKING A RAW BOARD FOR USE IN PRINTED CIRCUITS

[75] Inventors: Yoshio Kawasumi; Haruki Sato, both of Saitama, Japan

[73] Assignee: Nippon Mining Co., Ltd., Tokyo, Japan

[21] Appl. No.: 35,695

[22] Filed: May 3, 1979

[30] Foreign Application Priority Data

May 8, 1978 [JP] Japan .................. 53-53705

[51] Int. Cl.³ .................. C25D 5/10; C25D 5/56
[52] U.S. Cl. .................. 204/20; 204/38 B; 204/40
[58] Field of Search .................. 204/40, 38 B, 30, 20

[56] References Cited

U.S. PATENT DOCUMENTS

| | | | |
|---|---|---|---|
| 3,857,681 | 12/1974 | Yates | 204/40 |
| 3,918,926 | 11/1975 | Wolski | 204/40 |
| 3,918,927 | 11/1975 | Wells | 204/38 B |

OTHER PUBLICATIONS

Modern Electroplating, 2nd Edition, Edited by Frederick A. Lowenheim, 1963, pp. 172-187, 196-200.

*Primary Examiner*—T. M. Tufariello
*Attorney, Agent, or Firm*—William E. Jackson

[57] ABSTRACT

A method for preparing a raw board for use in printed circuits comprising the steps of first electroplating a foil or sheet of synthesized resins in an electrolytic bath containing copper sulfate, sulfuric acid, chlorine ion and a surface glazing agent including thiourea, and secondly electroplating the foil or sheet completed the above step in a conventional electrolytic bath containing copper sulfate and sulfuric acid. Also, an apparatus therefor is disclosed.

9 Claims, 1 Drawing Figure

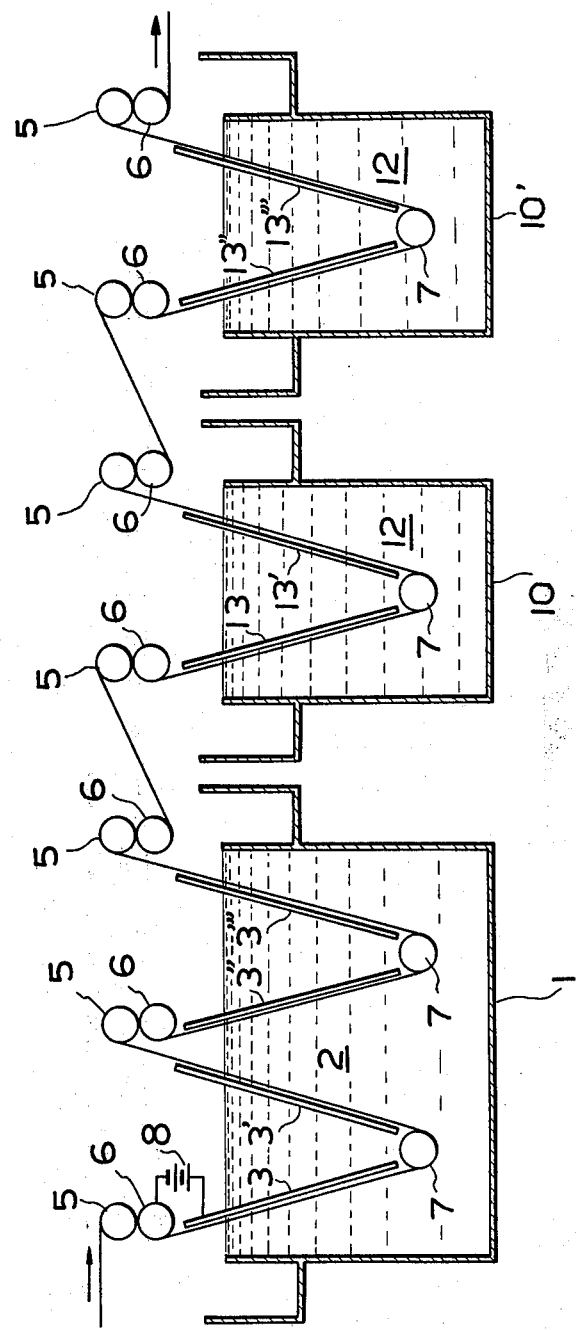

METHOD FOR MAKING A RAW BOARD FOR USE IN PRINTED CIRCUITS

BACKGROUND OF THE INVENTION

The present invention relates to a method for making a raw board for use in printed circuits.

Hitherto, raw boards for use in printed circuits had been prepared by heating and pressing copper foil with an adhesive, if desired, onto a plastic sheet such as phenol resins and epoxy resins.

In such a case, copper foil having a thickness of at least 30μ or so has generally been used because comparatively thin copper foil cannot be employed in smooth state due to the fact that the foil is liable to be broken or creased at the preparing or cutting stage of same prior to the heating and pressing stages at which the copper foil is heat-pressed onto a plastic sheet.

However, the use of the copper foil 30μ or so in thickness results in the occurrence of a side-etching phenomenon at the etched portions in the case where a given circuit is printed and then unnecessary copper portions are dissolved and removed by an etching operation, thus creating such problems that the breaking of the circuit occurs or a detailed circuit cannot be obtained.

U.S. Patent Application, Ser. No. 886826 filed Mar. 15, 1978 by J. Sato discloses a process for preparing a raw board for use in printed circuits which does not necessitate adhesion of a copper foil. The inventors of the present invention further undertook to improve the qualities of the raw board for use in printed circuits since room for improvement was left in the peeling strength and repeated folding resistance of the copper layer deposited on the surface of the raw board.

With regard to the peeling strength of the copper layer, it was found that far better peeling strength than a standard value required could be obtained by electroplating copper on a plastic substrate, which had adhered copper thereon, at 40°–90° C. with a copper sulfate electroplating bath containing a thiourea-including-additive which had hitherto been used as a surface glazing agent.

Although the copper layer deposited on the raw board thus obtained has excellent resistance to repeated-folding test (hereinafter referred to as "repeated folding resistance") as compared with that of a conventional raw board for use in printed circuits, there exists in the art a demand for obtaining further superior repeated-folding-resistance.

The inventors of the present invention carried out various experiments in wide range to improve the repeated-folding-resistance of the raw board while maintaining the peeling strength at a required level. As a result, it was found that the improved resistance may be obtained by the steps of (A) electroplating copper onto a plastic substrate at a given temperature with the above mentioned bath containing a thiourea including type additive and thereafter (B) further electroplating copper thereon with a conventional copper sulfate bath not containing the above additive. In addition, it was further found that the combination of the peeling strength and the repeated-folding-resistance may be optionally varied by controlling the ratio of the electroplated thickness of the copper layer obtainable with the bath containing the thiourea including additive to that of the copper layer obtainable with a bath not containing the aforementioned additive.

SUMMARY OF THE INVENTION

It is therefore an object of the invention to provide a method for preparing a raw board for use in printed circuits, which has excellent peeling strength and repeated-folding resistance in the copper layer deposited thereon.

Further objects of the invention will be clear from the following description.

PREFERRED EMBODIMENT OF THE INVENTION

As the insulating substrate used in the present invention, films of a synthesized plastic polymer such as polyvinyl chloride, polyethylene terephthalate, fluorinated ethylene propylene resins and the like, and sheets of a resins such as phenol resins, epoxy resins, and the like may be mentioned. A typical resin used is a polyimide resin.

Following the dewaxing treatment of the film or sheet with a conventional procedure, pretreatments such as cleaning, activation and/or roughening of the surface to be adhered to a metal is carried out in such a conventional manner as a chemical treatment and/or a mechanical treatment.

Following the pretreatments, the film or sheet is subjected to a mechanical copper deposition treatment with a vacuum evaporation process or is subjected to a chemical copper deposition treatment with a non-electroplating process. The thickness of the copper layer deposited on the film or sheet is at least 0.01μ, preferably 0.02μ or above. The copper layer is allowed to have such a thickness that it enables the flow of an electric current in a successive electroplating stage. In general, the thickness of the deposited copper layer is in the range of 0.1–0.5μ.

Thus, according to the method of the present invention, the substrate with a deposited copper layer thereon is subjected to electroplating treatment of two stages. The object of carrying out the first stage is to improve peeling strength of the copper layer deposited and that of the second stage resides in improvement of the repeated folding resistance of the layer.

The copper-electroplating treatment in the first stage is first illustrated hereinafter.

In the past, it has been well known that a surface-glazing agent is added to an electroplating bath containing copper sulfate in order to obtain a lustrous gilded surface. For the sake of the above, a surface glazing agent composed of thiourea or its organic derivative and a small amount of additives has been used. Presently there can be found several kinds of the glazing agents which have been practically used. Among these glazing agents, a typical one is UBAC No. 1 (prepared by Ebara Enfelco Co., Japan). The operating conditions of the electroplating bath using the thiourea including surface glazing agent have been established as follows:

TABLE 1

| The electroplating bath composition and electroplating conditions in UBAC process | |
|---|---|
| Copper sulfate (CuSO$_4$ . 5H$_2$O) | 225 g/l |
| Sulfuric acid (1.84 sg) | 44–60 g/l |
| UBAC No. 1 | 2–6 cc/l |
| Cl$^-$ | 10–30 ppm |

TABLE 1-continued

The electroplating bath composition and
electroplating conditions in UBAC process

| | |
|---|---|
| Anode | Copper including phosphorus |
| Current density (Cathode) | 3.3–6.6 A/dm$^2$ |
| Current density (Anode) | 1.6–3.3 A/dm$^2$ |
| Agitation | vigorously |
| Cathode current efficiency | almost 100% |
| Plating rate | 0.93 μ/min at 4.4 A/dm$^2$ |
| Filtration | continuously |
| Temperature | 24°–32° C. |

As noted in the Table 1, the temperature of the electroplating bath using the thiourea including surface glazing agent is in a range of 24°–32° C., and hydrochloric acid or common salt is used as the source of Cl$^-$.

The inventors of the present invention found in the course of repeated experiments as to the copper electroplating procedure using the thiourea including glazing agent that the use of the glazing agent results in the increase of peeling strength of the copper layer gilded without acting as a glazing agent at a temperature of 40°–90° C.

The first copper electroplating treatment is based on the above discovery.

The composition of the plating bath may be the same as the one used conventionally. The bath is composed of 200–250 g/l of copper sulfate and 40–65 g/l of sulfuric acid as major ingredients, and 2–6 ml/l of a thiourea including glazing additive and 10–30 mg/l (10–30 ppm) of chlorine ion are added thereto. The temperature of the plating bath is controlled at 40°–90° C. as stated above. The current density used is in the range of 100–500 A/m$^2$ in general although it varies depending on the extent of agitation used. The deposited copper layer obtained in this stage has a mat surface. This fact shows that the thiourea including glazing agent does not act as a brightner.

The film or sheet completed in the first stage copper plating treatment is subsequently subjected to the second copper electroplating treatment. The plating bath used in this stage may also be a conventional bath used hitherto such as, for example, the one composed typically of 200–250 g/l of copper sulfate and 40–65 g/l of sulfuric acid, which contains no additive as seen in the bath of the first stage. The temperature of the bath is in the range of 24°–32° C., typically it is ambient temperature. The current density used is about 100–300 A/m$^2$.

According to the process of the present invention, the combination of the peeling strength of the deposited copper layer on the raw board produced and the repeated folding resistance of the copper layer may optionally varied depending upon a quality required to a product.

The increase of the deposited copper layer thickness in the second copper electroplating treatment results in the improvement of the repeated-folding-resistance of the deposited copper layer, while results in the decrease of the peeling strength of the copper layer. As a general criterion, it is preferable that 20–70% of the total thickness of the deposited copper layer to be adhered onto a substrate is electroplated at the first stage and 30–80% of the total thickness is plated at the second stage.

The present invention will be further illustrated in more detail by way of the accompanying drawing.

FIG. 1 is a schematic view illustrating the steps for electroplating copper layer onto a substrate in the preparation of a raw board for use in printed circuits according to the present invention.

In FIG. 1, a sheet of polyimide, which is adhered copper layer 0.1–0.5μ thick thereon, is fed to the first electrolytic cell 1 from the left hand of the drawing for being subjected to the first copper electroplating treatment. The sheet is sent from a feeding roller through a given pickling bath and a washing bath. In the drawing, four copper anodes 3, 3', 3" and 3''' having been immersed in an electrolytic bath 2 has been provided in the first electrolytic cell 1. The anodes 3 and 3' and the other anodes 3" and 3''' have been arranged in the form of a pair of V shape so as to increase the effective area of the anode used. The sheet passes into an electrolytic bath through pinch rollers 5 and electric conduction rollers 6 to proceed to the neighborhood of the anode 3, and then changes the proceeding direction with the guide roller 7. The sheet goes out of the electrolytic bath once after passing the neighborhood of the anode 3', and thereafter, enters into an another electrolytic bath again through a pinch roller 5 and an electric conduction roller 6 in the same manner as described above. Thus, the first copper electroplating treatment is carried out with four anodes and four electric fields. An electric source 8 has been provided between the anode 3 and the electric conduction roller 6 and there is provided in like manner an electric source (not shown) separately or commonly between the anodes 3', 3" and 3''' and the corresponding electric conduction rollers. The electroplating of the sheet entering into the electric field close to the anode 3 is conducted with rather low electric current density because the thickness of the copper layer adhered on the sheet is still thin. Otherwise, the abscission of the sheet is liable to occur. The sheet having passed through the anode 3 has sufficient copper layer thereon to cause no abscission of the sheet if a higher electric current density would be applied. For example, the anode 3 flows 30 A of electric current and the anodes 3', 3" and 3''' flows 50 A of electric current respectively. The anodes 3', 3" and 3''' may have a common electric source and may also have separate electric source so as to flow electric currents of different intensities, or the electric source may be connected between the anodes and the corresponding electric conduction rollers so as to form a parallel circuit. However, it is advisable for the above reason that a separate electric source is used to the first anode 3 only or a parallel circuit capable of optionally adjusting electric current flowing therebetween is employed.

In order to make the clearance between the sheet and the anode variable, it is advisable that the inclination of the anodes and the location of the guide rollers are adjustable or the anodes 3, 3', 3" and 3''' capable of being transferred relatively to the location of the sheet are provided.

As noted above, the electrolytic solution is a copper sulfate solution containing a thiourea including additive and is kept at 40°–90° C. The thickness of the copper deposited on the sheet increases as the sheet proceeds in a state facing to face with the anodes 3, 3', 3" and 3'''. However, the copper-deposited sheet may be transferred from the pinch roller 5 to the subsequent second copper-electroplating step without further passing same into the electrolytic solution in the first stage if the thickness obtained after passing the area corresponding to the second anode 3' meets the requirement for the product.

The sheet departed from the first electrolytic cell is transferred to the second electroplating step through a washing cell (not shown). In the drawing, the second stage copper plating treatment has been given as the one consisting of two cells 10 and 10'. The electrolytic solution of the cells 10 and 10' is a conventional copper sulfate solution containing no additive as noted above. The sheet proceeds in the same state as in the first stage along the anodes 13, 13', 13" and 13"' through the pinch rollers 5, electric conduction rollers 6 and the guide rollers 7.

In the second copper-electroplating stage, the sheet may also be fed to a winder without passing the cell 10' after having passed the cell 10 only in accordance with the required thickness of the copper layer deposited.

Thereafter, the sheet is rolled round a winding reel through a washing cell, rust preventing cell, washing cell, dryer and a slitter. Preferably, the total length of the sheet is made about 1000–2000 m long and the distance between the feeding roller and the winding reel about 15 m long, and further, the passage between the feeding roller and the winding reel is kept in a chamber where a clean atmosphere is held and the pressure of the chamber is maintained at slightly higher pressure than atmospheric pressure. Into the chamber, is fed clean air through a filter. Thus, the sheet surface to be treated is prevented from agglutination of fine dusts and the like.

Further, the sheet having a width wider than that of the anodes is preferably used. For example, in case the width of the anodes is about 100 cm, the sheet about 110 cm wide is preferably used. Such a sheet is rolled round a winding reel after drying same with a dryer and cutting longitudinally with a slitter in about 108 cm width.

The present invention will be further illustrated by way of the following Examples.

EXAMPLE 1

A raw board for use in printed circuit was prepared with an apparatus as shown in the accompanying drawing by a two stages copper electroplating method using a polyimide sheet 50 cm wide which has a vapor-deposited copper layer $0.1\mu$ thick thereon.

As the electrolytic solution used in the first stage, an aqueous solution containing 225 g/l (Cu ≈ 57 g/l) of $CuSO_4.5H_2O$, 28 ml/l of sulfuric acid (sp. g. 1.84), 21 mg/l of 35% hydrochloric acid and 4 ml/l of the UBAC No. 1 additive (prepared by the Ebara Enfelco Co., Japan) was employed. The temperature of the bath was kept at 55° C.

The electroplating was carried out by continuously passing the polyimide sheet into the electrolytic bath at a rate of 9.6 m/hr. The first anode as shown in the accompanying drawing flowed 30 A of electric current and copper layer $0.07\mu$ thick was electrochemically deposited thereon. At that time, cathode current density and anode current density were 150 A/m² and 162 A/m² respectively.

Thereafter, electric current intensity was raised to 50 A because the sheet entering the electric field of the anode 3' had had a copper layer of $0.17\mu$ thick. The electroplating was continued under the conditions of a cathode current density of 250 A/m² and an anode current density of 270 A/m² until the thickness of the desposited copper layer reached to $5\mu$. The same current density as used to the anode 3' was used to the remaining two anodes.

At the second stage, an aqueous solution consisting of 225 g/l of $Cu_2SO_4.5H_2O$ and 28 ml/l of sulfuric acid (sp. g. 1.84) was used and 50 A of electric current flowed. The electroplating was continued under the conditions of a cathode current density of 250 A/m² and an anode current density of 270 A/m² until the total thickness of the electrochemically deposited copper layer reached $10.0\mu$. The ratio of the thickness obtained at the first stage to that obtained at the second stage was 1:1.02.

The sheet taken out from the second cell used in the second stage was rolled round a winding reel through a washing cell, rust-preventing cell and a dryer.

Test results of the product showed that the sheet thus obtained had a peeling strength of 1.2 Kg/cm and it was higher than the standard value of 1.0 Kg/cm conventionaly allowable. Further, the number of the repeated folding resistance of the product was 3 times.

The peeling test piece was pulled at a rate of 5 cm/min. in the direction of 180°. The repeated folding test was conducted in such a manner that a test piece was projected from the top of a roof-shaped slant forming an angle of 90° to turn the projected portion of the test piece in right and left directions by 135° respectively (totally 270°) under a tension of 1 Kg, and the number of frequency required before the copper layer was cut was measured.

The soldering test of the product, carried out at 280°–310° C. showed a better result as compared with those obtained by bonding a copper foil with an adhesive and exfoliation between the substrate and the deposited copper layer did not occur.

EXAMPLE 2

The peeling strengths and the repeated folding resistances of the products obtained by changing the ratio of the thickness of copper-deposited layer in the first stage to that in the second stage were measured in the same manner as in Example 1.

| The thickness obtained in the first stage/ The thickness obtained in the second stage | The number of repeated folding resistance | Peeling strength (Kg/cm) |
| --- | --- | --- |
| 1:3 | 7 | 1.0 or above |
| 1:1 | 3 | 1.2 or above |
| 2:1 | 3 | 1.2 or above |
| 3:1 | 2 | 1.5 or above |

On the contary, the number of repeated folding resistance of test pieces which were not subjected to the second stage treatment was only 2.

CONTROL 1

The product which was subjected to a treatment using an electrolytic bath not containing UBAC No. 1 additive in the first stage, at 30° C. merely showed 0.5 Kg/cm of peeling strength.

CONTROL 2

A repeated folding resistance test was conducted with a commercially available A-1 raw board for use in printed circuits, which had a copper layer $20\mu$ thick and which had plated further copper layer $5\mu$ thick thereon.

The total copper layer of the raw board was cut by barely a test of one time.

What we claim is:

1. A method for preparing a raw board for use in printed circuits comprising the steps of:

(A) depositing copper layer onto a film or sheet of synthesized resins;

(B) subjecting said copper-deposited film or sheet to an electrochemical treatment at a temperature between 40° C. and 90° C. with a first electroplating bath containing copper sulfate, sulfuric acid, chlorine ion and a surface glazing agent including thiourea; and (C) subjecting thereafter the film or sheet to an electrochemical treatment with a second electroplating bath containing copper sulfate and sulfuric acid.

2. The method of claim 1 wherein an electric current of lower intensity is first used and then a higher intensity electric current is employed in the first electroplating bath.

3. A method for making a fllexible laminate of plastic and copper for use in printed circuits, comprising:

(a) subjecting a flexible plastic film to vapor deposition with copper so as to vapor-deposit a first layer of copper directly onto the surface of said film, (b) immersing said film and first copper layer into a first electroplating bath including a brightener as an additive, said bath being as a temperature of about 40° C. to 90° C., and plating a second layer onto said first copper layer; and (c) subjecting thereafter the film to an electrochemical treatment with a second electroplating bath containing copper sulfate and sulfuric acid.

4. The method of claim 3 wherein an electric current of lower intensity is first used and then a higher intensity electric current is employed in the first electroplating bath.

5. The method of claim 3 wherein 20–70% of the total thickness of the deposited copper layer to be adhered onto the film is electroplated at the step (b) and 30–80% thereof is plated at the step (c).

6. A method for making a raw board for use in printed circuits, comprising the steps of (a) subjecting a very long film of a flexible plastic which can be easily rolled in a roll form to vapor deposition with a metal so as to vapor-deposit the metal directly onto the surface of the flexible film, (b) continuously immersing the flexible film in an electrochemical bath including as an additive a brightener which has its brightening effect only at a temperature between about 15° C. to 30° C., said bath being kept at a temperature between about 40°–90° C. where said brightner has no brightening effect so that a metal is continuously electroplated on the surface of the metal previously vapor-deposited on the surface of the flexible film, and (c) subjecting thereafter the film to an electrochemical treatment with a second electrochemical bath containing copper sulfate and sulfuric acid.

7. A method for preparing a raw board for use in printed circuits comprising the steps of:

(a) continuously feeding a copper-deposited long film of snythesized resins as a cathode;

(b) guiding the film along at least a pair of anodes;

(c) subjecting thereby the film to an electrochemical treatment at 40°–90° C. with a first electrolytic bath containing copper sulfate, sulfuric acid, chlorine ion and glazing agent including thiourea;

(d) guiding thereafter the film above said first electrolytic bath;

(e) transferring the film along another pair of anodes; and (f) subjecting thereby said film to a second electrochemical treatment with a second electrolytic bath containing copper sulfate and sulfuric acid.

8. The method of claim 7 wherein said pairs of anodes are arranged in a V-shape, respectively.

9. A flexible raw board for use in printed circuits as produced by the method of any one of the preceding claims 1, 2, 3, 4, 5, 6, 7 and 8.

* * * * *